(12) United States Patent
Sorg

(10) Patent No.: US 12,009,633 B2
(45) Date of Patent: Jun. 11, 2024

(54) LASER DEVICE AND METHOD FOR MANUFACTURING A LASER DEVICE

(71) Applicant: OSRAM Opto Semiconductors GmbH, Regensburg (DE)

(72) Inventor: Joerg Sorg, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 645 days.

(21) Appl. No.: 17/285,244

(22) PCT Filed: Oct. 17, 2019

(86) PCT No.: PCT/EP2019/078153
§ 371 (c)(1),
(2) Date: Apr. 14, 2021

(87) PCT Pub. No.: WO2020/079118
PCT Pub. Date: Apr. 23, 2020

(65) Prior Publication Data
US 2021/0376562 A1    Dec. 2, 2021

(30) Foreign Application Priority Data

Oct. 17, 2018  (DE) .................... 10 2018 125 787.2
Nov. 30, 2018  (DE) .................... 10 2018 130 578.8

(51) Int. Cl.
*H01S 5/02216*    (2021.01)
*H01S 5/0222*    (2021.01)
(Continued)

(52) U.S. Cl.
CPC ........ *H01S 5/02216* (2013.01); *H01S 5/0222* (2013.01); *H01S 5/02255* (2021.01);
(Continued)

(58) Field of Classification Search
CPC ............. H01S 5/02216; H01S 5/02255; H01S 5/02257; H01S 5/0222
See application file for complete search history.

(56) References Cited

U.S. PATENT DOCUMENTS 5,359,496 A    10/1994    Kornrumpf et al.
9,250,406 B2 *  2/2016    Chang ................. H01L 23/5381
(Continued)

FOREIGN PATENT DOCUMENTS

CN    104247172 A    12/2014
CN    104681455 A    6/2015
(Continued)

OTHER PUBLICATIONS

International Search Report and Written Opinion in corresponding International Application No. PCT/EP2019/078153 mailed on Jan. 23, 2020, 15 pages.
(Continued)

*Primary Examiner* — Michael Carter
(74) *Attorney, Agent, or Firm* — MH2 TECHNOLOGY LAW GROUP LLP

(57) ABSTRACT

A laser device comprises a hermetic housing that has an interior and is made at least in part of printed circuit board material, a laser element located in the interior, and at least one inorganic layer which hermetically shields the interior from the printed circuit board material.

19 Claims, 6 Drawing Sheets

(51) Int. Cl.
*H01S 5/02255* (2021.01)
*H01S 5/02257* (2021.01)
*H05K 1/11* (2006.01)
*H05K 1/18* (2006.01)

(52) U.S. Cl.
CPC .......... *H01S 5/02257* (2021.01); *H05K 1/115* (2013.01); *H05K 1/181* (2013.01)

(56) References Cited

U.S. PATENT DOCUMENTS

| | | | |
|---|---|---|---|
| 10,193,026 B2 * | 1/2019 | Rudmann | ............... H01S 5/183 |
| 10,418,780 B1 * | 9/2019 | Hwang | ............... H01S 5/06808 |
| 2004/0086011 A1 | 5/2004 | Bhandarkar | |
| 2007/0116077 A1 * | 5/2007 | Farmer | ............... H01S 5/02476 |
| | | | 372/50.12 |
| 2011/0280270 A1 * | 11/2011 | Hayashi | ............... H01S 5/0232 |
| | | | 372/50.1 |
| 2012/0044967 A1 * | 2/2012 | Cole | ............... H01S 5/02208 |
| | | | 372/92 |
| 2014/0341247 A1 | 11/2014 | Strauss et al. | |
| 2015/0003482 A1 | 1/2015 | Monadgemi et al. | |
| 2015/0103856 A1 | 4/2015 | Hagino et al. | |
| 2015/0145149 A1 | 5/2015 | Wachter et al. | |
| 2016/0245998 A1 | 8/2016 | Lai et al. | |
| 2016/0247976 A1 | 8/2016 | Rudmann et al. | |
| 2016/0341395 A1 * | 11/2016 | Kiyota | ............... F21V 5/04 |
| 2021/0075186 A1 * | 3/2021 | Zheng | ............... H01S 5/02325 |

FOREIGN PATENT DOCUMENTS

| | | |
|---|---|---|
| JP | 2006066466 A | 3/2006 |
| JP | 2007328201 A | 12/2007 |
| JP | 2012038819 A | 2/2012 |
| WO | 2014010140 A1 | 1/2014 |

OTHER PUBLICATIONS

Chinese Office Action issued in corresponding Chinese Patent Application No. 2019800686375, dated Dec. 4, 2023, with English language translation, 18 pages.

* cited by examiner

LASER DEVICE AND METHOD FOR MANUFACTURING A LASER DEVICE

CROSS-REFERENCE TO RELATED APPLICATION

The present application claims the priorities of German patent applications 10 2018 125 787.2 and 10 2018 130 578.8, filed with the German Patent and Trademark Office on Oct. 17, 2018 and Nov. 30, 2018, respectively. The disclosure content of German patent applications 10 2018 125 787.2 and 10 2018 130 578.8 is hereby incorporated by reference herein in its entirety into the disclosure content of the present application.

FIELD

The present invention relates to a laser device and a method for manufacturing a laser device.

BACKGROUND

Lasers, especially power lasers, which emit short wavelength light such as green or blue light, currently require to be encapsulated cost-intensive. To ensure stable operation in the long term, the laser elements must be operated in a clean atmosphere. The reason for this is that, especially in the case of semiconductor lasers emitting short wavelength radiation, high field strengths occur at the facet in conjunction with a large beam divergence. As a result, particles and also molecules from the environment are transported to the facet. Due to the high energy densities in the area of the laser facet, decomposition and deposition or accumulation of particles and decomposition products can occur at the facet. Unless the reaction products are perfectly transparent, they interact with the emitted radiation, which in turn leads to additional heating in the area of the facet. The relationship described above can lead to self-reinforcing effects that can ultimately destroy the laser (COD, catastrophic optical damage).

Even if the deposits are perfectly transparent, they can change the characteristics of the facet mirroring, which in turn results in an undesirable detuning of the resonator.

To circumvent the effects described above, short wavelength radiation emitting semiconductor lasers are built into hermetic housings, also called packages. Hermetic means that the housings are sealed so tightly that no particles or molecules that could cause impairment or destruction of the laser can enter the housing from the outside.

Conventional laser packages meet the hermeticity requirements, but the available solutions are costly to manufacture and not very suitable for further miniaturization and integration.

SUMMARY

The present invention is based, among other things, on the object of creating an advantageous laser device with a hermetic housing and a laser element integrated in the housing, wherein the laser device can be manufactured in particular at low cost and is suitable for further miniaturization and integration. Furthermore, a corresponding method for manufacturing a laser device is to be disclosed.

An object of the invention is solved by a laser device with the features of claim 1. Furthermore, an object of the invention is solved by a method for manufacturing a laser device with the features of claim 11. Advantageous embodiments and further developments of the invention are indicated in the dependent claims.

A laser device according to one embodiment comprises a hermetic or hermetically encapsulated or hermetically sealed housing having an interior space or cavity and being made at least partially of a printed circuit board material. At least one laser element is arranged in the interior space of the housing. Further, the laser device comprises at least one inorganic layer that hermetically shields the interior space from the printed circuit board material.

A printed circuit board, also called PCB, circuit card, circuit board or printed circuit, is a carrier for electronic components. It is used for mechanical fastening and electrical connection. Printed circuit boards consist of electrically insulating material with electrically conductive connections, so-called conductor tracks, adhering to it. Fiber-reinforced plastic is often used as the electrically insulating material. For example, the electrically insulating material may consist of glass fibers embedded in an epoxy or silicone resin. The conductive traces of a printed circuit board are usually etched from a thin layer of copper.

The main disadvantages of conventional printed circuit board technology are the organic outgassing from the printed circuit board material and the lack of hermicity. To overcome these disadvantages, the invention proposes to hermetically shield the interior space of the housing containing the laser element from the printed circuit board material by the at least one inorganic layer.

The at least one inorganic layer can cover surfaces of the printed circuit board material and, if applicable, surfaces of other components of the laser device in such a way that no printed circuit board material is in contact with the interior space or the atmosphere in the interior space and, furthermore, it is ensured that no organic or partially organic material from the printed circuit board material can enter the interior space or at most so much organic or partially organic material from the printed circuit board material can enter the interior space that the functionality or the integrity of the laser element is not impaired thereby. In other words, the printed circuit board material is hermetically encapsulated by the at least one inorganic layer with respect to the interior space of the housing.

The hermetic shielding (or encapsulation) of the printed circuit board material from the interior space of the housing by the at least one inorganic layer should be configured in such that at most so much gaseous organic or partially organic substances from the printed circuit board material enter the interior space that the laser element is not damaged or impaired. For example, the leak rate of gaseous organic or partially organic substances from the printed circuit board material through the at least one inorganic layer into the interior space of the housing can be at most $10^{-4}$ mbar*l/s or at most $10^{-5}$ mbar*l/s or at most $10^{-6}$ mbar*l/s or at most $10^{-7}$ mbar*l/s or at most $10^{-8}$ mbar*l/s or at most $10^{-9}$ mbar*l/s. The limit value depends, for example, on the organic or partially organic substances contained in the printed circuit board and on the type of laser used, and can be determined experimentally.

Printed circuit board technology offers comparatively low material costs and also attractive manufacturing costs due to the possibility of parallelizing processes (batch processing). Another advantage is the possibility of achieving a high degree of integration and miniaturization through 3D interconnection and embedding of components.

Furthermore, the at least one inorganic layer can be used to hermetically encapsulate the laser element to protect the facet and prevent gaseous organic or partially organic substances from being released from the printed circuit board material and entering the interior space, where the substances could potentially be deposited on the laser facet.

Furthermore, the laser device allows the atmosphere in the interior space of the housing in which the laser element is operated to be selectively adjusted. For example, the interior space can be filled with dry air and/or the oxygen partial pressure can be selectively adjusted. Optionally, the use of getters is also possible.

The laser device can be used, for example, in AR (augmented reality) data glasses, smart data glasses (smart glass) that project information into the lens of the glasses or directly onto the retina, flash lights especially from mobile devices, headlights or other lighting used in vehicles, or compact projection devices.

The laser element can be designed as a semiconductor laser or laser diode. Furthermore, the laser element can be realized as a semiconductor chip.

In particular, at least one laser element integrated into the housing may emit short wavelength laser radiation, wherein the wavelength of the laser radiation is no more than 570 nm. For example, the at least one laser element may be configured to emit green, blue, or violet light or ultraviolet (UV) radiation. However, it may well be envisaged that multiple laser elements are integrated into the housing and one or more of these laser elements emit light with a wavelength greater than 570 nm. For example, the laser device may be designed as a so-called RGB package with three laser elements emitting red, green and blue light. In this case, the laser radiation of the laser element emitting red light has a wavelength greater than 570 nm.

According to one embodiment, the housing comprises a printed circuit board as a base plate. The printed circuit board can be used as a mounting and/or connection plane to mount the laser device and electrically couple it to another device or system.

By using the printed circuit board as a base plate, the laser device can be easily integrated into an application, for example as a SMT (surface-mount technology, surface-mount) component. The printed circuit board should be encapsulated towards the interior space of the housing by the at least one inorganic layer, so that no gaseous organic or partially organic substances can be released from the printed circuit board material and enter the interior space.

An insert part can be integrated or inserted into the printed circuit board, on which the laser element is arranged. However, the laser element does not have to be placed directly on the insert part, there may well be one or more component(s) between the insert part and the laser element.

The insert part is made of an inorganic material and, in particular, is configured in such a way that no gaseous organic or partially organic substances can be released from the insert part and enter the interior space. The insert part meets the requirements regarding hermicity, so that no particles or molecules that could cause impairment or destruction of the laser can enter the interior space of the housing from the outside through the insert part. In particular, the insert part is made entirely of one or more inorganic material(s). For example, the insert part can be made of silicon, AlN, $Al_2O_3$, SiC, ceramics, or other suitable materials. Furthermore, the insert part can serve as a heat sink to allow heat generated by the laser element during operation to be dissipated to the outside. In this case, the insert part should be made of a material with sufficient thermal conductivity. Further heat sinks, for example in the form of carbon foils, can also be integrated into the housing.

In order to be able to electrically contact the laser element arranged in the interior space and, if necessary, further components from outside the housing, the insert part can have at least one electrical and hermetic via. The at least one electrical via may extend from a first main surface of the insert part to a second main surface of the insert part opposite the first main surface. The at least one electrical via allows electrical signal and/or power transmission from the exterior of the housing to the interior space and in the reverse direction. The at least one electrical via can be connected to one or more conductive traces on the printed circuit board, in particular on the bottom surface of the printed circuit board that serves as a mounting and/or connection surface.

The base plate can also be a ceramic base plate or a base plate made of an inorganic material without an additional insert part. In this case, the at least one electrical and hermetic via can be integrated into the ceramic or inorganic base plate.

By using the printed circuit board as a base plate, further components can be integrated into the housing. For example, at least one active component and/or at least one passive component can be integrated or embedded in the printed circuit board. Active components can be, for example, switching elements, such as a MOSFET (metal-oxide-semiconductor field-effect transistor, Metal Oxide Semiconductor Field Effect Transistor), a GaNFET (gallium nitride field-effect transistor, Gallium Nitride Field Effect Transistor) or a transistor with a different design. Passive components can be capacitors, for example.

By integrating active and/or passive components into the printed circuit board, it is possible to place switching elements and capacitors in the immediate vicinity of the laser element in order to be able to realize a low-induction design for very fast switching times. This allows the application of high-frequency technology for data transmission and the use of the laser device in, for example, LiDAR (light detection and ranging) applications and intelligent data glasses (smart glass).

In addition to the base plate, the active and/or passive components can also be integrated into the rest of the printed circuit board material built into the housing. For example, the components can be incorporated into the side walls and/or the cover plate of the housing, provided that these components are at least partially made of printed circuit board material.

It can further be provided that at least one side wall of the housing is at least partially made of a printed circuit board material. For example, a further plate made at least partially of an organic material and comprising a recess can be arranged on the printed circuit board. The recess in the plate may at least partially form the interior space of the housing. The organic material from which the further plate is made can be the same material from which the electrically insulating part of the printed circuit board is made. Just as with the printed circuit board, the at least one inorganic layer can be applied to the further plate to hermetically encapsulate it with respect to the interior space of the housing and to prevent gaseous organic or partially organic substances that may be harmful to the laser element from being released from the organic material and entering the interior space.

The housing can comprise a cover plate that is at least partially made of a material that is transparent to the laser radiation emitted by the laser element. This allows the laser radiation to be guided out of the housing and provide it for a desired application. If necessary, one or more optical elements can be arranged in the interior space to direct the laser radiation in the desired direction. The cover plate can be mounted on the side walls of the housing. The joints between the cover plate and the side walls can be hermetically sealed.

Suitable materials for the cover plate include glass, sapphire ($Al_2O_3$) or silicon. These materials are transparent to the laser radiation and sufficiently stable to aging.

The cover plate can be made entirely of one or more of the aforementioned materials, or it can be made only partially of these materials. For example, the cover plate can be made at least partially of an organic material in which an insert part made of a material transparent to the laser radiation emitted by the laser element is integrated.

The organic material of the cover plate can be the same material from which the electrically insulating part of the printed circuit board is made. This can be advantageous because, in this case, the base plate and the cover plate comprise similar thermal expansion coefficients. Just as with the printed circuit board, the at least one inorganic layer may be applied to the further plate to hermetically encapsulate it from the interior space of the housing and prevent gaseous organic or partially organic substances that may be harmful to the laser element from being released from the organic material and entering the interior space.

The insert part in the cover plate can be made of glass, sapphire ($Al_2O_3$) or silicon, for example.

The at least one inorganic layer can be at least one metal layer which is galvanically, i.e. electrochemically, deposited on the printed circuit board material, i.e. in particular the base plate, the side walls and/or optionally the cover plate. For example, copper, in particular so-called ED-Cu (electrically deposited copper), can be used as the metal layer. Furthermore, several metal layers may be stacked on top of each other. Alternatively, the at least one inorganic layer can consist of inorganic, non-metallic layers or layer stacks, which are applied, for example, by means of sputtering, vapor deposition, PVD (physical vapour deposition, physical vapor deposition) or CVD (chemical vapour deposition, chemical vapor deposition) processes. The materials and layer thicknesses used for the at least one inorganic layer are to ensure hermetic encapsulation of the organic components of the package.

Furthermore, shielding can be improved by providing appropriate shields in the housing, for example by laminating metal foils or metal-coated foils. This embodiment not only has the advantage of gas tightness, but can also shield high frequency electromagnetic radiation.

A method according to one embodiment is for manufacturing a laser device. The method provides that a housing is at least partially made of a printed circuit board material, at least one laser element is arranged in an interior space of the housing, the interior space is shielded from the printed circuit board material with at least one inorganic layer, and the housing is hermetically sealed.

The method for manufacturing a laser device can include the laser device embodiments described above.

A printed circuit board into which an insert part made of an inorganic material is inserted can be provided as a base plate of the housing, and the laser element can be arranged on the insert part.

According to one embodiment, a further plate made at least in part of an organic material and comprising a recess can be arranged on the printed circuit board. The recess can at least partially form the interior space of the housing.

Further, the at least one inorganic layer may be applied to the printed circuit board and the further plate, and thereafter, a cover plate made at least partially of a material transparent to the laser radiation emitted by the laser element can be applied to the further plate.

The cover plate can be fixed to the further plate by means of a joining material that comprises a metallic material, a low-temperature glass, a suitable solder material and/or an inorganic adhesive material or consists entirely of such a material. Furthermore, the joining material should ensure the hermicity of the package. For example, the metallic material can be an AuSn solder joint having a process temperature in the range of about 280 to 320° C., an AuIn solder joint having a process temperature in the range of about 180 to 220° C., or an AuAu compression bonding layer having a process temperature in the range of about 200 to 250° C. For example, tellurium-based glasses with a process temperature in the range of about 350 to 500° C. can be used as low-temperature glasses. If an inorganic adhesive material is used as the joining material, it must be sufficiently hermetically sealed so that no gaseous organic or partially organic substances can enter the interior space through the adhesive material that could damage or impair the laser element.

In an alternative embodiment, a cover plate made at least in part of a material transparent to laser radiation emitted by the laser element is provided, and a further plate made at least in part of an organic material and comprising a recess forming at least in part the interior space of the housing is fixed on the cover plate.

The at least one inorganic layer can be applied to the printed circuit board, and after fixing the further plate to the cover plate, at least one further inorganic layer can be applied to the further plate to shield the interior space from the further plate. Thereafter, the cover plate can be applied to the printed circuit board together with the further plate.

The cover plate or the further plate can be fixed to the printed circuit board by means of a joining material which, as in the embodiment described above, can comprise a metallic material, a low-temperature glass and/or an inorganic adhesive material, or may consist entirely of such a material, and which may ensure the hermicity of the housing.

Further, the at least one inorganic layer can be at least one metal layer electrodeposited on the printed circuit board material.

BRIEF DESCRIPTION OF THE DRAWINGS

In the following, embodiments of the invention are explained in more detail with reference to the accompanying drawings. In these schematically show.

DETAILED DESCRIPTION

In the following detailed description, reference is made to the accompanying drawings, which form a part of this description and in which specific embodiments in which the invention may be practiced are shown for illustrative purposes. Since components of embodiments may be positioned in a number of different orientations, the directional terminology is for illustrative purposes and is not limiting in any way. It is understood that other embodiments may be used and structural or logical changes may be made without departing from the scope of protection. It is understood that the features of the various embodiments described herein may be combined with each other, unless specifically indicated otherwise. Therefore, the following detailed description is not to be construed in a limiting sense. In the figures, identical or similar elements are provided with identical reference signs where appropriate.

Figure 1:
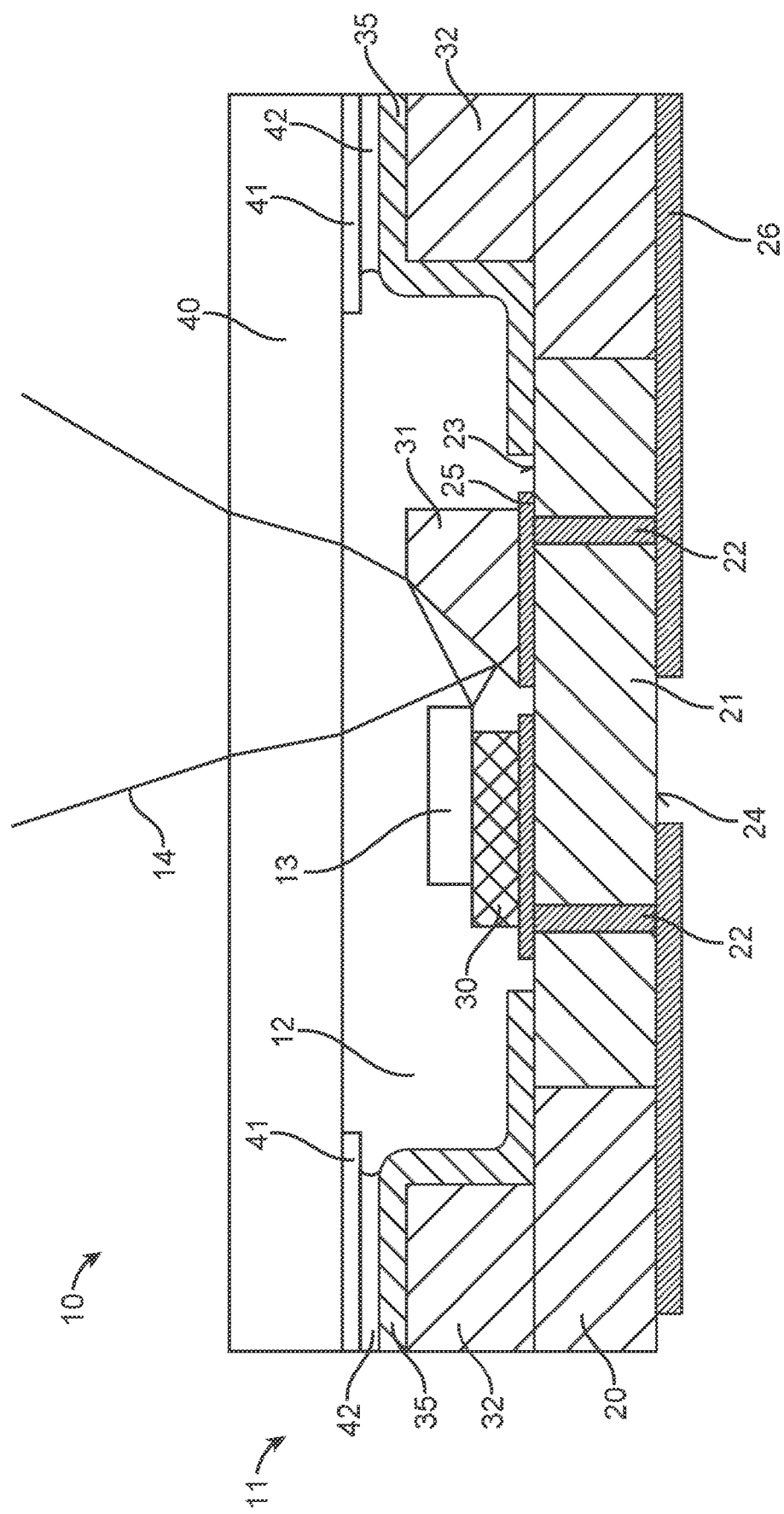
FIG. 1 a schematic illustration of an embodiment of a laser device.

FIG. 1 schematically shows a laser device 10 with a hermetic housing 11, which comprises an interior space 12. A laser element 13 is arranged in the interior space 12 of the housing 11, which is configured in particular to generate green or blue laser radiation 14.

The housing 11 contains a printed circuit board 20 as a base plate, the body of which contains organic material at least in part. Integrated into the printed circuit board 20 is an insert part 21 made of an inorganic material, for example silicon, AlN, $Al_2O_3$ or SiC. The insert part 21 comprises electrical vias 22 extending from a first main surface 23 of the insert part 21 to a second main surface 24 of the insert part 21 opposite the first main surface 23 and made of a metal, for example copper.

On the first and second main surfaces 23, 24 respective metallization layers 25 and 26 are deposited thereon, which are formed as conductor traces and are connected to the vias 22 at desired locations. The metallization layer 26 on the second main surface 24 of the insert part 21 also extends to the bottom surface of the printed circuit board 20. In the present embodiment, the first main surface 23 of the insert part 21 is formed flush with the top surface of the body of the printed circuit board 20, which is at least partially made of an organic material. Further, the second main surface 24 of the insert part 21 is formed flush with the bottom surface of the body of the printed circuit board 20.

The bottom surface of the printed circuit board 20, together with the second main surface 24 of the insert part 21 and the metallization layer 26, serve as a mounting and/or connection surface of the laser device 10. The laser device 10 can be mounted, in particular soldered, to an external component with the bottom surface of the printed circuit board 20.

The metallization layer 25 can be electrically connected to the laser element 13, which allows the laser element 13 to be electrically driven from outside the laser device 10 via the metallization layers 26.

Further active or passive components can be integrated into the printed circuit board 20, which are not shown in FIG. 1.

A subcarrier 30 is mounted on the insert part 21, on which in turn the laser element 13 is mounted. Furthermore, an optical element 31 is arranged on the insert part 21, which serves to direct the laser radiation 14 generated by the laser element 13 in the desired direction and, if necessary, to shape it.

A further plate 32 is mounted on the printed circuit board 20. Together with the printed circuit board 20, the plate 32 may form a multi-layer printed circuit board (multi-layer PCB). The plate 32 forms the side walls of the housing 11 and comprises a recess through which the interior space 12 of the housing 11 is formed. The plate 32 is also made of a printed circuit board material and contains organic material just like the printed circuit board 20.

Gaseous organic or partially organic substances can basically escape from the printed circuit board 20 and the plate 32. To prevent these substances from entering the interior space 12 of the housing 11 and damaging the facet of the laser element 13, the printed circuit board 20 and the plate 32 are hermetically sealed from the interior space of the housing 11 by means of a layer of an inorganic material designed as a diffusion barrier 35.

In the present embodiment, the diffusion barrier 35 is formed of electrodeposited copper. The diffusion barrier 35 covers all surfaces of the printed circuit board 20 and the plate 32 that would otherwise be in contact with the atmosphere of the interior space 12. Further, the diffusion barrier 35 completely covers the top surface of the plate 32 and the joints between the printed circuit board 20 and the insert parts 21 to provide hermetic encapsulation.

On its top surface, the housing 11 is closed by a cover plate 40 through which the laser radiation 14 exits. In the present embodiment, the cover plate 40 is made entirely of glass. The cover plate 40 comprises metallizations 41 at its edges, with which the cover plate 40 is fixed to the diffusion barrier 35 applied to the top surface of the plate 32. By means of a joining material 42, the joint between the cover plate 40 and the diffusion barrier 35 is hermetically sealed. The joining material 42 can be, for example, a metallic material, a low temperature glass or an inorganic adhesive material as described above. Alternatively, the cover plate 40 can be hermetically bonded to the diffusion barrier 35 by laser welding.

To manufacture the laser device 10 shown in FIG. 1, the printed circuit board 20, the plate 32, the laser element 13, the diffusion barrier 35 and the components are first mounted or joined together in the interior space 12 of the housing 11. Only then the cover plate 40 is placed on top and is hermetically sealed.

Figure 2:
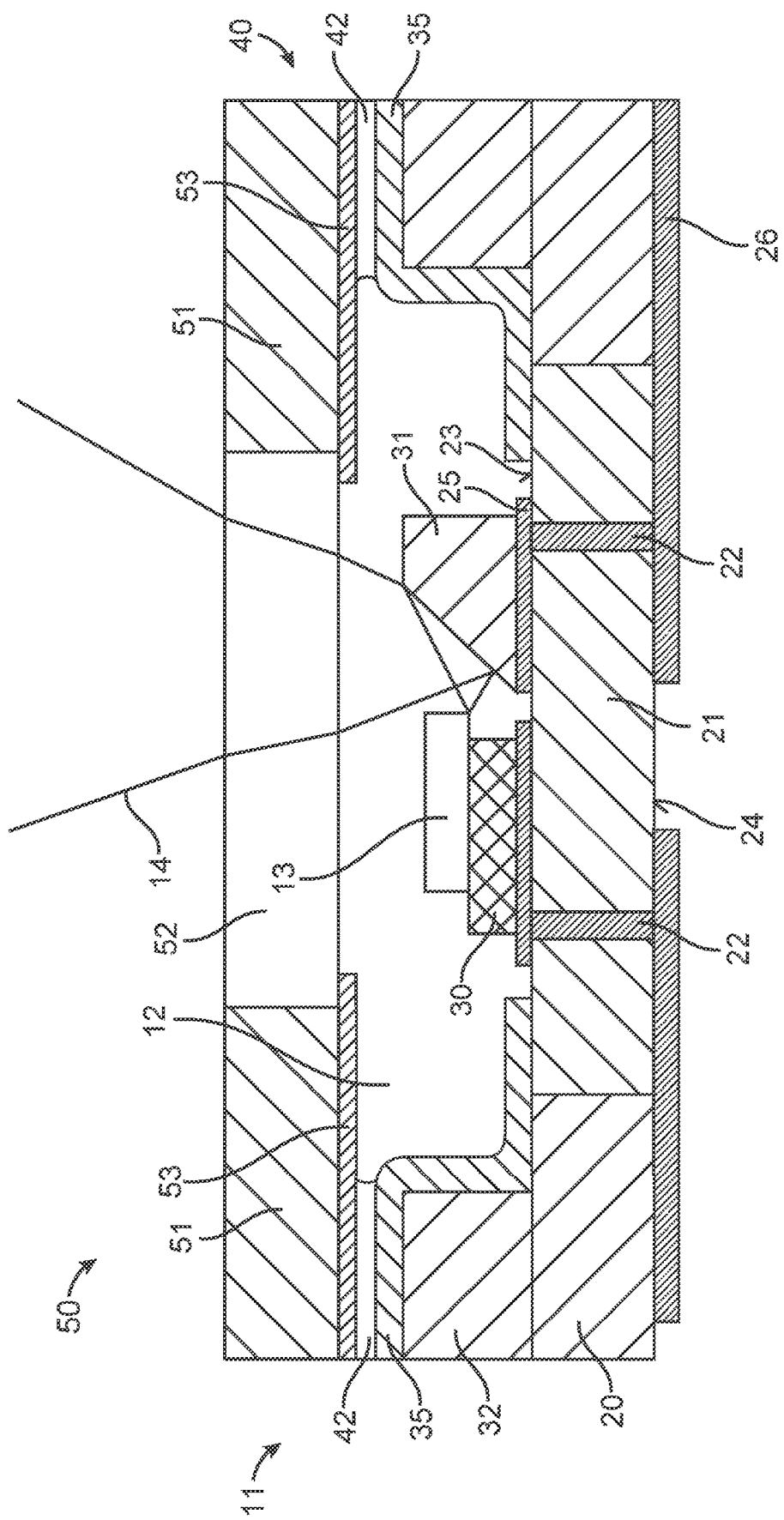
FIG. 2 a variant of the embodiment shown in FIG. 1.

FIG. 2 schematically shows a laser device 50 that is largely identical to the laser device 10 shown in FIG. 1.

In contrast to the laser device 10, the cover plate 40 of the laser device 50 is not made entirely of glass, but consists of a plate 51 made of an organic material in which an insert part 52 made of glass is integrated. The plate 51 can be made of the same material as the body of the printed circuit board 20. The insert part 52 is arranged in the plate 51 in such a way that the laser radiation 14 can exit through the insert part 52.

To prevent gaseous organic or partially organic substances from being released from the plate 51 into the interior space 12, the plate 51 is hermetically encapsulated from the interior space 12 by a layer 53 of an inorganic material. In the present embodiment, the layer 53 is an electrodeposited copper layer.

Figure 3:
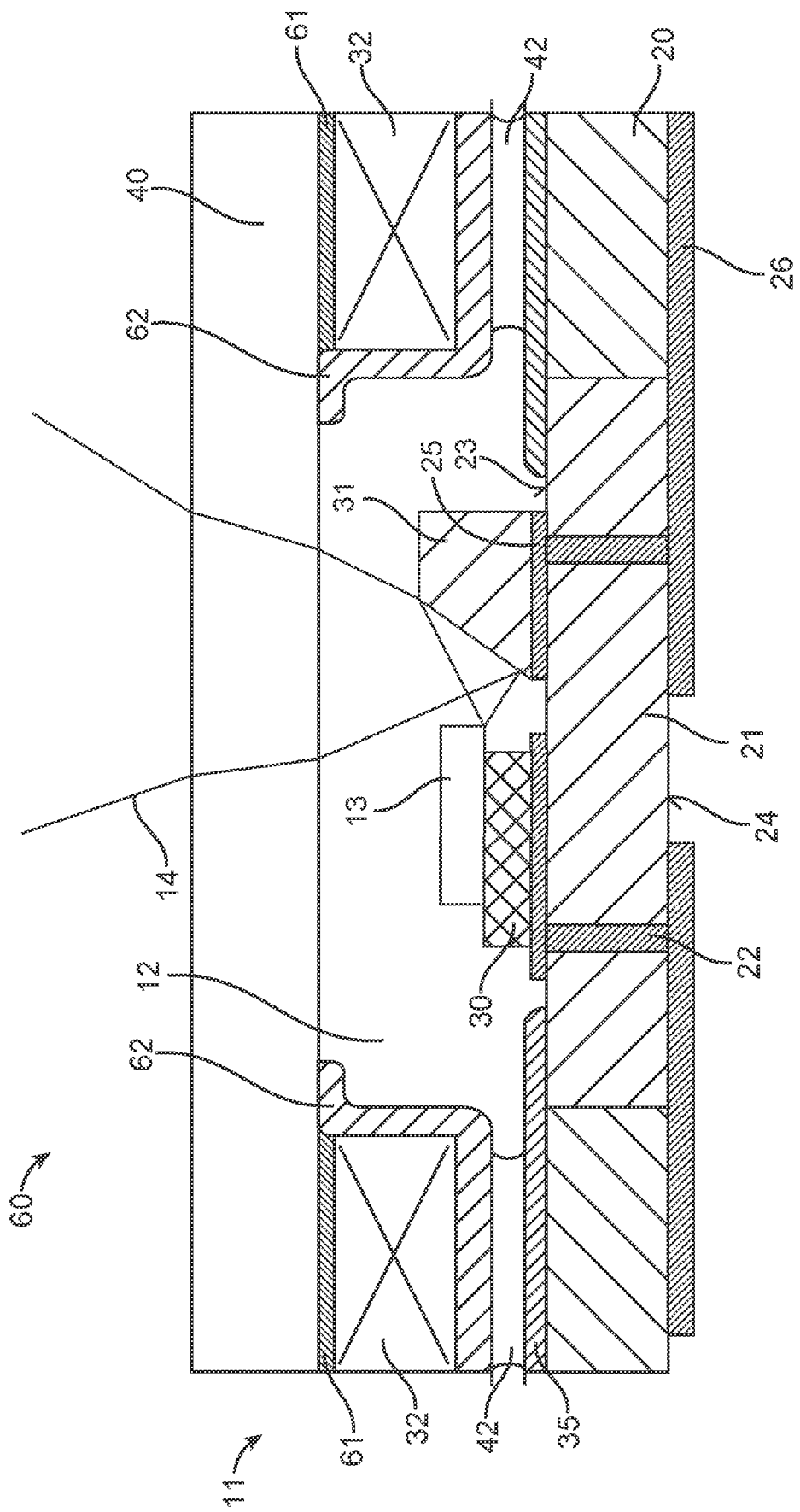
FIG. 3 a schematic illustration of a further embodiment of a laser device.

FIG. 3 schematically shows a laser device 60 which largely corresponds to the laser device 10 shown in FIG. 1. The differences between the laser devices 10 and 60 are due to the different manufacturing processes.

To manufacture the laser device 60 shown in FIG. 3, the laser element 13 and the optical element 31 are mounted on the insert part 21 integrated into the printed circuit board 20. Furthermore, the diffusion barrier 35 is applied to the printed circuit board 20.

However, the plate 32 forming the side walls of the housing 11 is not fixed directly to the printed circuit board 20, but to the cover plate 40 by means of an adhesive 61, for example an organic adhesive. Subsequently, the plate 32 is hermetically encapsulated towards the interior space 12 by a layer of an inorganic material formed as a diffusion barrier 62 to prevent gaseous organic or partially organic substances from diffusing from the plate 32 into the interior space 12. The bottom surface of the plate 32 is also covered by the diffusion barrier 62. In the present embodiment, the diffusion barrier 62 is an electrodeposited copper layer.

The two components described above are then joined together and the joint is hermetically sealed by laser welding or with the aid of joining material 42 or another suitable material.

Figure 4:
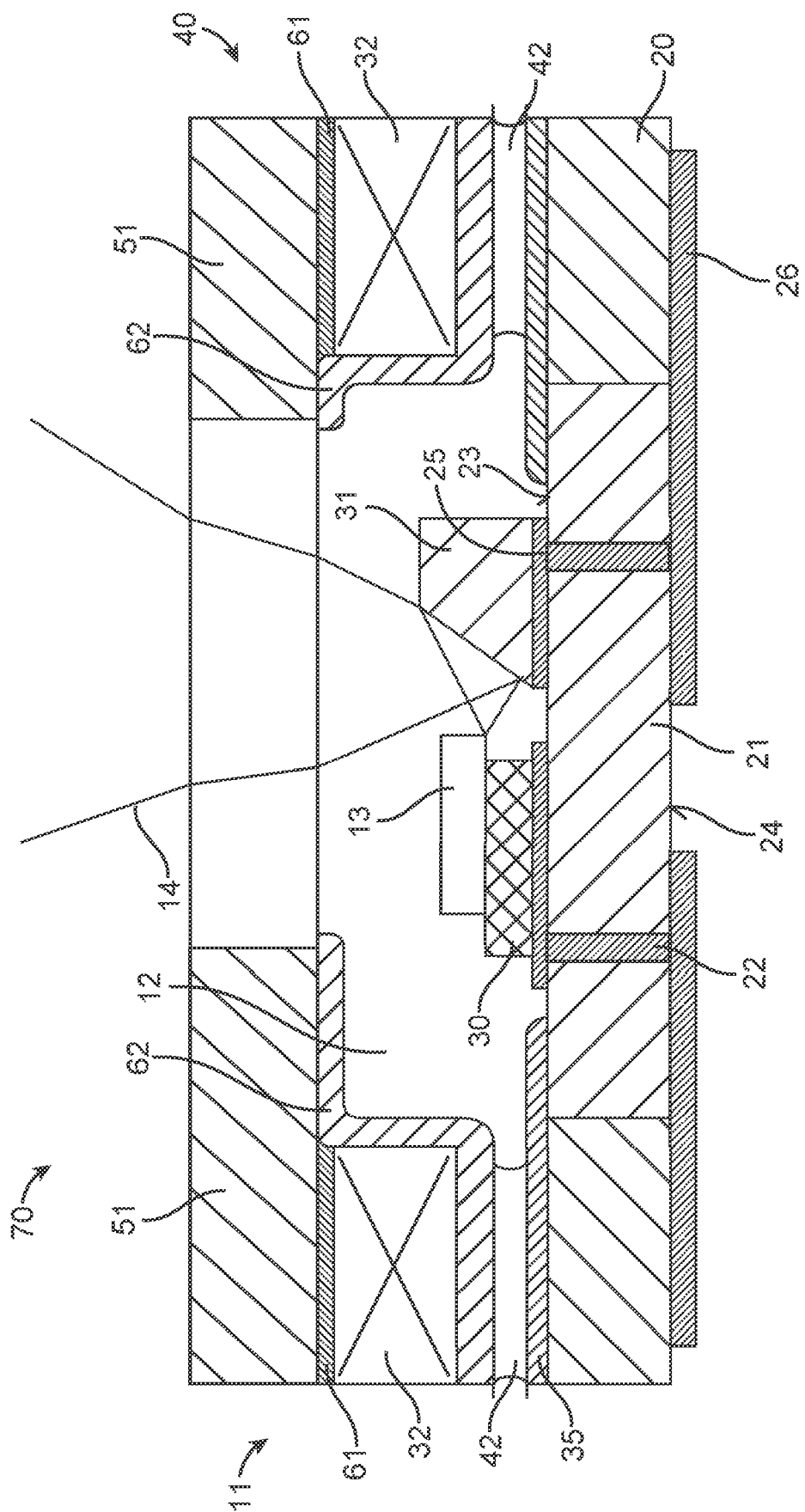
FIG. 4 a variant of the embodiment shown in FIG. 3.

FIG. 4 schematically shows a laser device 70 that is largely identical to the laser device 60 shown in FIG. 3.

In contrast to the laser device 60, the cover plate 40 of the laser device 70 is not made entirely of glass, but as in the case of the laser device 50 shown in FIG. 2, the cover plate 40 consists of the plate 51 made of an organic material, into which the insert part 52 made of glass is integrated. In the laser device 70, the diffusion barrier 62 extends over the surface of the plate 51 facing the interior space 11, so that no gaseous organic or partially organic substances can be released from the plate 51 into the interior space 12.

Figure 5:
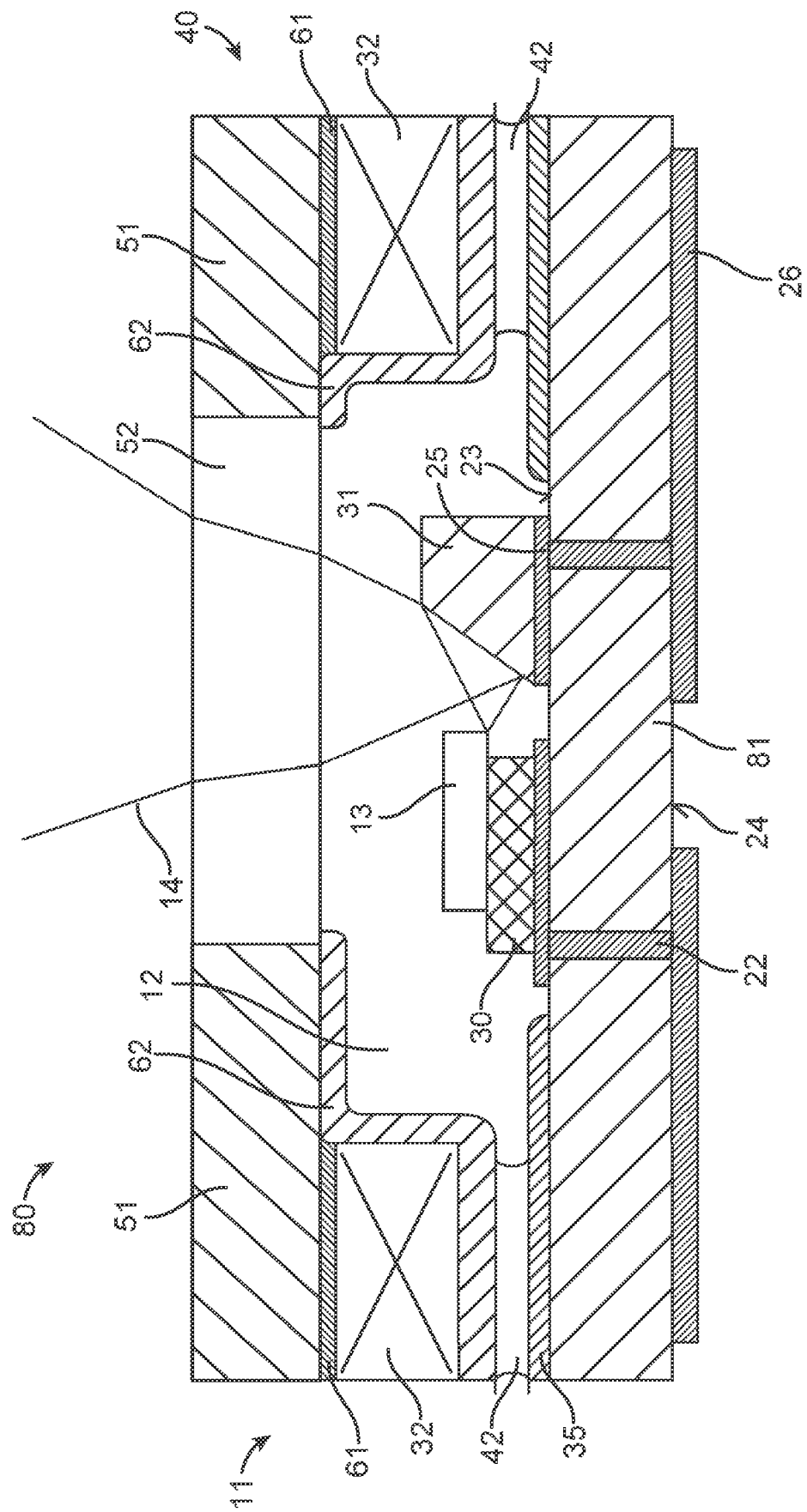
FIG. 5 a variant of the embodiment shown in FIG. 4.

FIG. 5 schematically shows a laser device 80 that is largely identical to the laser device 70 shown in FIG. 4.

In contrast to the laser device 70, the base plate does not comprise a printed circuit board in which an insert part made of an inorganic material is integrated, but the base plate is designed without an insert part in the laser device 80 and comprises a continuous ceramic base plate 81 or a base plate 81 made of an inorganic material.

Figure 6:
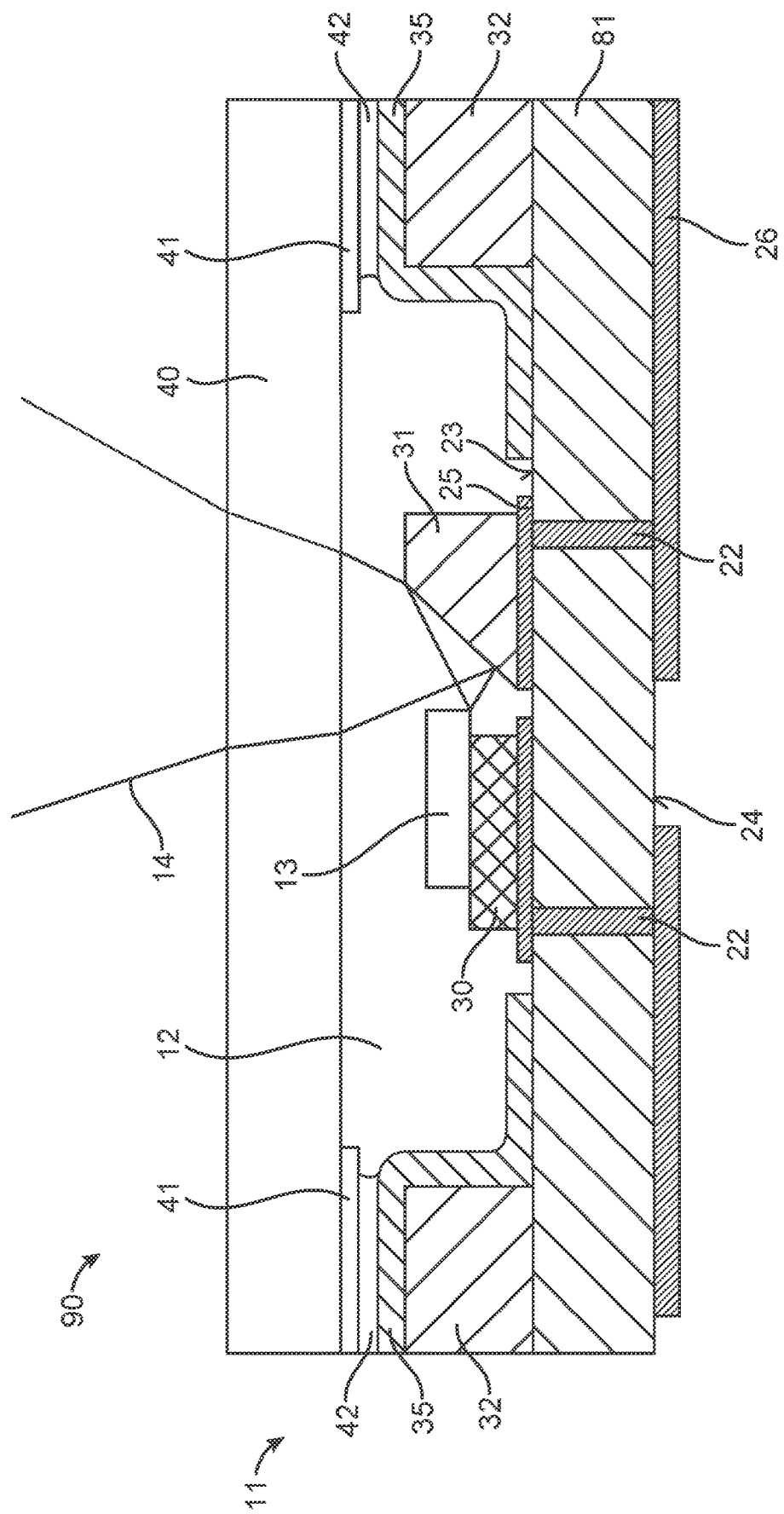
FIG. 6 a variant of the embodiment shown in FIG. 1.

FIG. 6 schematically shows a laser device 90 that is largely identical to the laser device 10 shown in FIG. 1.

In contrast to the laser device 10, the base plate does not comprise a printed circuit board in which an insert part made of an inorganic material is integrated, but the base plate is designed without an insert part in the laser device 90 and comprises the continuous ceramic base plate 81 or base plate 81 made of an inorganic material as in the laser device 80 shown in FIG. 5.

The cover plate 40 also has no insert part and is made entirely of glass. The cover plate 40 comprises metallizations 41 at its edges, with which the cover plate 40 is fixed to the diffusion barrier 35 applied to the upper surface of the plate 32. By means of a joining material 42, the joint between the cover plate 40 and the diffusion barrier 35 is hermetically sealed. It is also conceivable to dispense with the metallizations 41, so that the joining material 42 is in direct contact with the cover plate 40.

The invention claimed is:

1. A laser device, comprising:
 a hermetic housing having an interior space and being at least partially made of printed circuit board material,
 a laser element arranged in the interior space, and
 at least one inorganic layer hermetically shielding the interior space from the printed circuit board material and in contact with the printed circuit board.

2. The laser device according to claim 1, wherein the laser element is configured to emit laser radiation having a wavelength that is at most 570 nm.

3. The laser device according to claim 1, wherein the housing comprises a printed circuit board, in which an insert part made of an inorganic material is integrated, as a base plate and the laser element is arranged on the insert part.

4. The laser device according to claim 3, wherein the insert part comprises at least one electrical via.

5. The laser device according to claim 1, wherein the housing comprises a ceramic or inorganic base plate and the laser element is arranged on the ceramic or inorganic base plate, and wherein the ceramic or inorganic base plate comprises in particular at least one electrical via.

6. The laser device according to claim 1, wherein at least one active component and/or at least one passive component are integrated into the printed circuit board material.

7. The laser device according to claim 1, wherein a further plate, which is at least partially made of an organic material and which comprises a recess, is arranged on the printed circuit board, and the recess at least partially forms the interior space of the housing.

8. The laser device according to claim 1, wherein the housing comprises a cover plate which is at least partially made of a material which is transparent to the laser radiation emitted by the laser element.

9. The laser device according to claim 8, wherein the cover plate is at least partially made of an organic material in which an insert part made of a material transparent to the laser radiation emitted by the laser element is integrated.

10. The laser device according to claim 1, wherein the at least one inorganic layer is at least one metal layer electrodeposited on the printed circuit board material.

11. A method for manufacturing a laser device, comprising:
 making a housing at least partially of a printed circuit board material,
 arranging a laser element in an interior space of the housing,
 hermetically shielding the interior space from the printed circuit board material with at least one inorganic layer, and
 hermetically sealing the housing by inserting an insert part comprising an inorganic material into a printed circuit board.

12. The method according to claim 11, further comprising:
 providing the insert part and printed circuit board as a base plate housing; and
 arranging the laser element on the insert part.

13. The method according to claim 12, further comprising:
 arranging a further plate, which is at least partially made of an organic material and which comprises a recess, on the printed circuit board, wherein the recess at least partially forms the interior space of the housing.

14. The method according to claim 13, further comprising:
 applying the at least one inorganic layer to the printed circuit board and the further plate, and
 applying thereafter a cover plate made at least partially of a material transparent to the laser radiation emitted by the laser element to the further plate.

15. The method according to claim 14, wherein the cover plate is fixed to the further plate by means of a joining material comprising a metallic material, a low temperature glass and/or an inorganic adhesive material.

16. The method according to claim 12, further comprising providing a cover plate made at least partially of a material transparent to the laser radiation emitted by the laser element, and fixing a further plate made at least partially of an organic material and comprising a recess on the cover plate, and wherein the recess at least partially forms the interior space of the housing.

17. The method according to claim 16, further comprising applying the at least one inorganic layer to the printed circuit board, and after fixing the further plate to the cover plate, applying at least one further inorganic layer to the further plate to shield the interior space from the further plate, and thereafter applying the cover plate to the printed circuit board together with the further plate.

18. The method according to claim 17, wherein the cover plate together with the further plate is fixed to the printed circuit board by a joining material comprising a metallic material, a low temperature glass and/or an inorganic adhesive material.

19. The method according to claim 11, wherein the at least one inorganic layer comprises at least one metal layer electrodeposited on the printed circuit board material.

* * * * *